(12) United States Patent
Kussian et al.

(10) Patent No.: US 12,206,381 B2
(45) Date of Patent: Jan. 21, 2025

(54) FILTER CHAINS WITH IMPROVED SIGNAL TO NOISE RATIO

(71) Applicant: Infineon Technologies AG, Neubiberg (DE)

(72) Inventors: Reinhard Kussian, Klagenfurt (AT); Andrea Manzini, Rome (IT)

(73) Assignee: Infineon Technologies AG, Neubiberg (DE)

( * ) Notice: Subject to any disclaimer, the term of this patent is extended or adjusted under 35 U.S.C. 154(b) by 24 days.

(21) Appl. No.: 18/100,601

(22) Filed: Jan. 24, 2023

(65) Prior Publication Data

US 2024/0250666 A1   Jul. 25, 2024

(51) Int. Cl.
| | | |
|---|---|---|
| *H03H 17/06* | (2006.01) | |
| *H03H 17/00* | (2006.01) | |
| *H03H 17/02* | (2006.01) | |

(52) U.S. Cl.
CPC ........ *H03H 17/06* (2013.01); *H03H 17/0027* (2013.01); *H03H 17/0219* (2013.01); *H03H 17/0275* (2013.01); *H03H 2017/0692* (2013.01)

(58) Field of Classification Search
CPC ............... H03H 17/06; H03H 17/0027; H03H 17/0219; H03H 17/0275; H03H 2017/0692
See application file for complete search history.

(56) References Cited

U.S. PATENT DOCUMENTS 4,472,785 A * 9/1984 Kasuga .............. H03H 17/0288
708/313

* cited by examiner

*Primary Examiner* — Jung Kim
(74) *Attorney, Agent, or Firm* — Eschweiler & Potashnik, LLC

(57) ABSTRACT

Methods and apparatus are provided for adapting gain elements in digital filter chains. In one example, a digital filter chain includes a first digital filter and a second digital filter having an input coupled to an output of the first digital filter. A common gain is applied to signal samples passing between the first digital filter and the second digital filter, the common gain corresponding to a product of an output gain associated with the first digital filter and an input gain associated with the second digital filter. In another example, a digital filter includes an adjustable input gain element and an adjustable output gain element. The adjustable input gain element is configured to apply a gain value to an input signal sample, the gain value comprising a resultant difference of a bitshift configured for the digital filter and a bitwidth extension value. The adjustable output gain element is configured to apply an opposite of the gain value to an output signal sample.

13 Claims, 11 Drawing Sheets

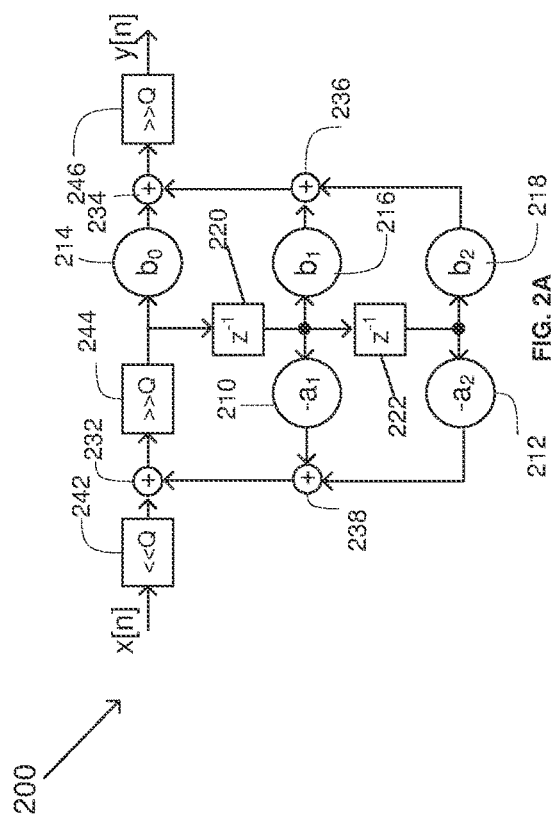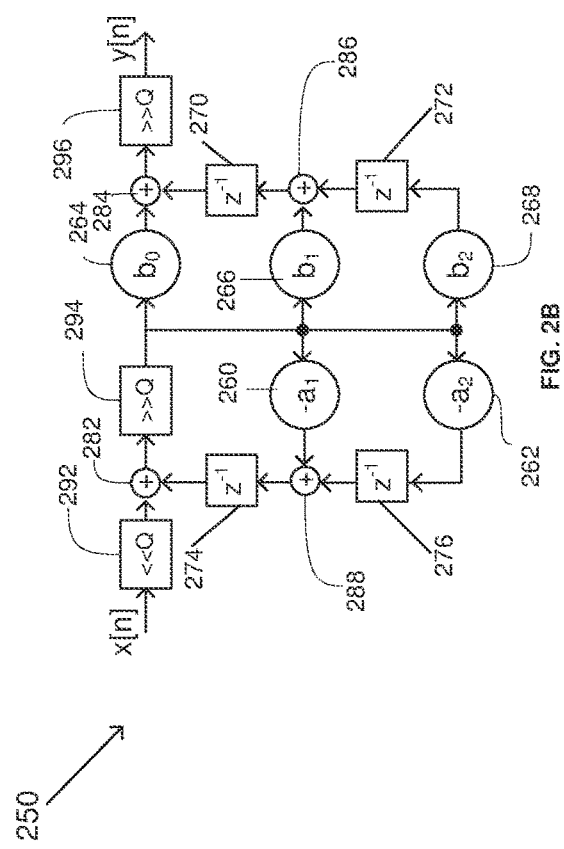

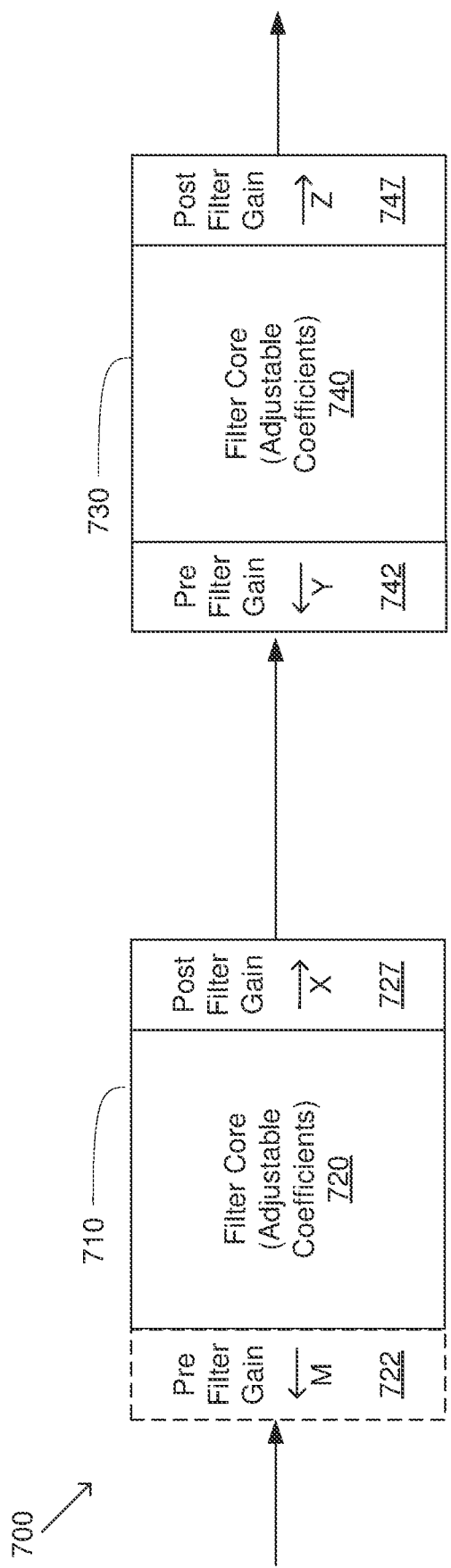
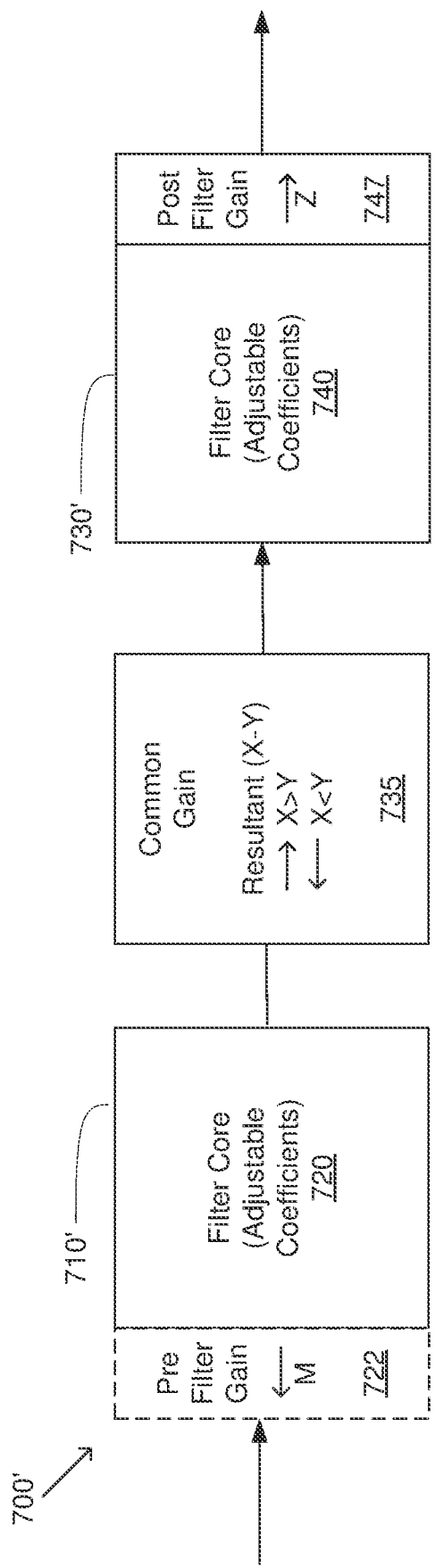
FIG. 7A
FIG. 7B

FILTER CHAINS WITH IMPROVED SIGNAL TO NOISE RATIO

FIELD

The present disclosure relates to the field of digital finite impulse response (FIR) filters and infinite impulse response (IIR) filters.

BACKGROUND

Modern microcontrollers include powerful processors with parallel processing and computation acceleration capabilities to process a wide array of input signals to generate control signals.

BRIEF DESCRIPTION OF THE DRAWINGS

Some examples of circuits, apparatuses and/or methods will be described in the following by way of example only. In this context, reference will be made to the accompanying Figures.

FIGS. 2A and 2B are functional block diagrams of example IIR filters.

FIGS. 7A and 7B are functional block diagrams of example filter chains, in accordance with various aspects described.

DETAILED DESCRIPTION

Figure 1:
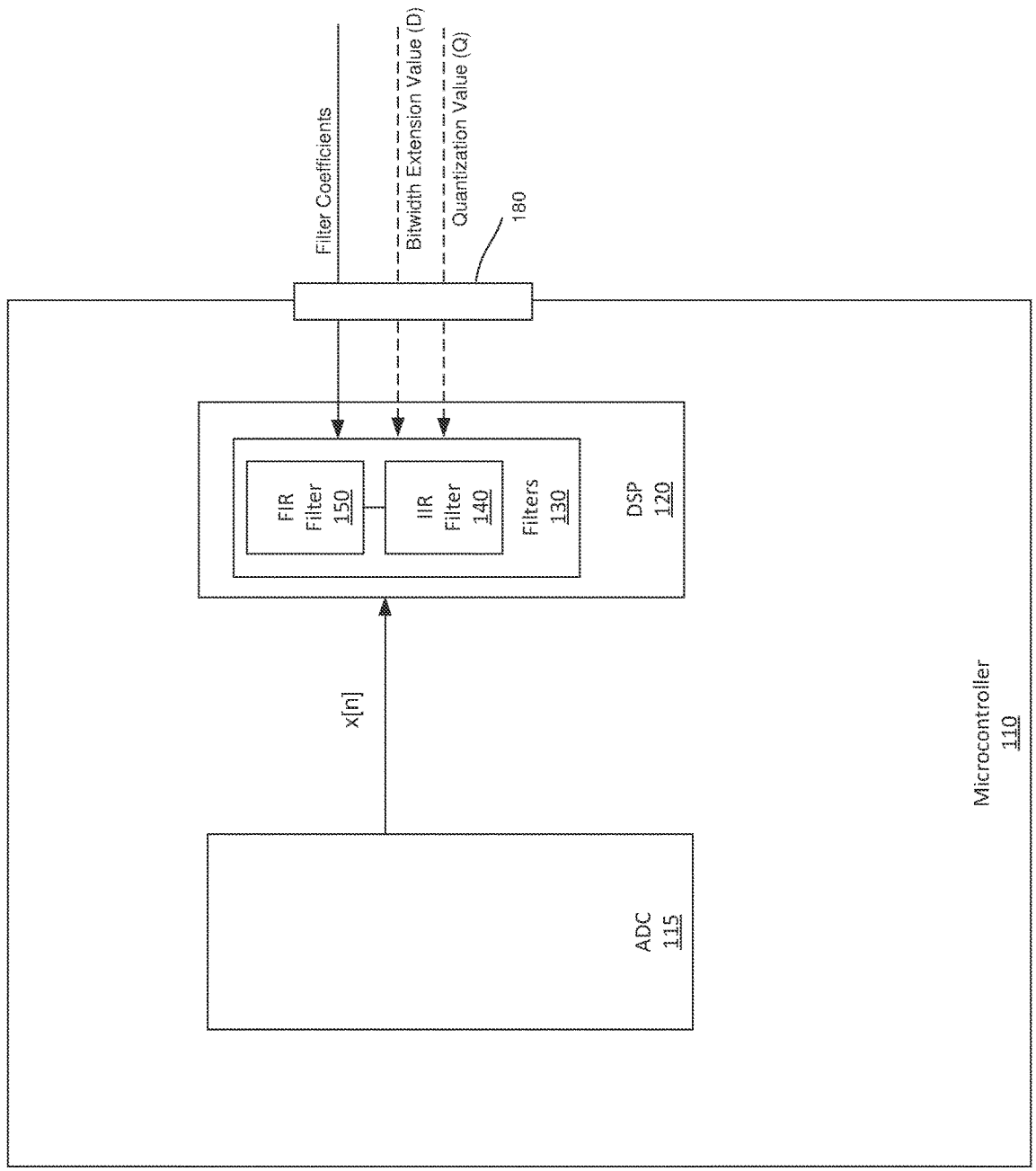
FIG. 1 is a block diagram of an example microcontroller that includes a digital signal processor (DSP), in accordance with various aspects described.

FIG. 1 illustrates an exemplary microcontroller 110. The microcontroller 110 includes an analog-to-digital converter 115 that converts various received analog signals to corresponding sampled signals x[n]. A DSP 120 provides configurable digital processing functionality. For example, the DSP 120 provides filters 130, such as IIR filter(s) 140 and FIR filter(s) 150 that can be instantiated by a user based on configurable filter coefficients via a programming interface 180. A quantization value Q may be programmed through the interface 180 to define a quantization related shift as will be discussed below. An optional bitwidth extension value D may be programmed through the interface 180 to further configure the filters 130 as will be discussed below.

Described herein are methods, systems, and circuitries that improve the SNR and/or bandwidth utilization of filter chains that include IIR filter elements.

FIGS. 2A and 2B illustrate examples of IIR filters 200, 250 that may be configured using the IIR filter 140 of FIG. 1. The IIR filters input a sampled signal x[n] (e.g., output by the ADC 115 on microcontroller 110 of FIG. 1) and output a filtered sampled signal y[n]. IIR filters 200, 250 are of second order or biquadratic, and are commonly identified as biquad filters. Biquad IIR filters (hereinafter biquads) such as those illustrated in FIGS. 2A and 2B are common building blocks of filter chains (e.g., chains of IIR filters 140 of FIG. 1) used to process signals. There are many alternative biquad designs, two of which have been selected as examples for the purposes of this disclosure. Other IIR filters, of different orders or design may be implemented per the solutions disclosed herein to provide improved signal to noise ratio (SNR) and/or bandwidth utilization.

FIG. 2A illustrates a second order IIR 200 in direct form 2 (DF2) (hereinafter DF2 or DF2 biquad). FIG. 2B illustrates a second order IIR 250 in transposed direct form 1 (DF1T)(hereinafter DF1T or DF1T biquad). The specific design differences between filter 200 and 250 will not be described here for the sake of brevity. Rather, common functional elements that may be used to implement a filter of either type will be the focus of the disclosure. The functional elements of the filters 200, 250 may be implemented in either hardware, software, or a combination of hardware and software.

In general, a biquadratic IIR filter (biquad) has a transfer function that is the ratio of two quadratic functions. The coefficients of the denominator quadratic function are referred to as "a" coefficients and the coefficients of the numerator quadratic function are referred to as "b" coefficients. These coefficients are configured for an instantiated biquad (e.g., through the programming interface for the microcontroller 110 of FIG. 1) to control the filtering properties exhibited by the biquad. Specifically the coefficient values control a weight that is multiplicatively applied to a signal within a branch of the biquad. For example, the coefficient values may define a bitshifting operation to be performed on a signal within a branch of the biquad to generate a product signal. Biquad 200 includes weighting elements 210, 212 for "a" coefficients and weighting elements 214, 216, 218 for "b" coefficients. Biquad 250 includes weighting elements 260, 262 for "a" coefficients and weighting elements 264, 266, 268 for "b" coefficients. Thus, the value of the weight applied by each of the weighting elements is individually controlled based on an associated "a" and "b" coefficient value.

Delay elements are used to store a number of previous versions of signal samples according to an order of the IIR filter. Biquads have two levels of delay elements. Biquad 200 includes delay elements 220 in a first level and 222 in a second level. Biquad 250 includes delay elements 270, 274 in a first level and delay elements 272, 276 in a second level. The delay elements and weighting elements act together to generate products, each of which are related to a different weighting of a signal sample. For example, in the biquad 200 there are five products: the output of weighting elements 210, 212, 214, 216, 218 and in the biquad 250 the products are the outputs of weighting elements 260, 262, 264, 266, 268. In the illustrated examples, weighting elements that apply "a" coefficients are in a feedback path of the biquad while weighting elements that apply "b" coefficients are in a feedforward path of the biquad. Other naming conventions for the coefficients may be used. The products are combined within the biquad to effectuate feedback and feedforward aspects. Biquad 200 includes a first level feedback summing element 232, a first level feedforward summing element 234, a second level feedback summing element 238, and a second level feedforward summing element 236. Similarly, biquad 250 includes a first level feedback summing element 282, a first level feedforward summing element 284, a second level feedback summing element 288, and a second level feedforward summing element 286. A summing element may include adder, an accumulator, or any combination of hardware and/or software that is capable of executing a summing operation on two or more signals.

As a signal sample x[n] progresses through the filter branches, the number of bits in the samples increases due to the multiplication and summing operations. The signal sample may be truncated for storing in delay elements. Quantization related gain elements are included in the biquad to perform a shifting operation that may shift a signal sample left by Q bits to add LSBs or shift a signal sample right by Q bits to remove LSBs so that the truncated values that are stored within the filter elements contain more meaningful information. The number of bits Q by which the sample values are shifted may be equal to log 2K, where K is a scaling factor applied to the coefficients within the weighting elements (not shown in FIGS. 2A, 2B, see FIG. 5). The value of Q may be pre-configured based on expected use cases or, in some examples, may be programmed by way of a programmable interface (e.g., 180 in FIG. 1). It is understood that, in general, each shifting operation introduces quantization error. Biquad 200 includes the following quantization related gain elements: an input gain element 242, an intermediate gain element 244 and an output gain element 246. Similarly, biquad 250 includes the following quantization related gain elements: an input gain element 292, an intermediate gain element 294, and an output gain element 296. Throughout this disclosure, the terms "gain" and "bitshift" may be used somewhat interchangeably. It is to be understood that a bitshift operation is one way that a gain operation may be accomplished in a digital or software-implemented filter.

A number of biquads may be connected in a cascade or chain manner to create higher order filters. These cascaded biquads are also known as cascaded or a series second-order section (SOS) form of an IIR. When the biquad 200 is connected to a another biquad (not shown) the input gain element 242 or 292 of the other biquad will be adjacent to the output gain element 246 of the first biquad. Likewise, when the biquad 250 is connected to another biquad (not shown) the input gain element 242 or 292 of the other biquad will be adjacent to the output gain element 296 of the first biquad. This means that between stages of the filter chain, an output gain element will perform a first shift operation, introducing quantization error and then an input gain element will perform an opposite shift operation (of possibly equal magnitude but opposite direction). This results in an input sample being provided to the other biquad first level feedback summing element 232 or 282 that has the same bits as were output by the first level feedforward summing element 234 or 284 but with a number of bits (equal to the number of shifts) having been erased.

SNR Optimized Gain Adjustments in Adjacent Filters

Figure 3A:
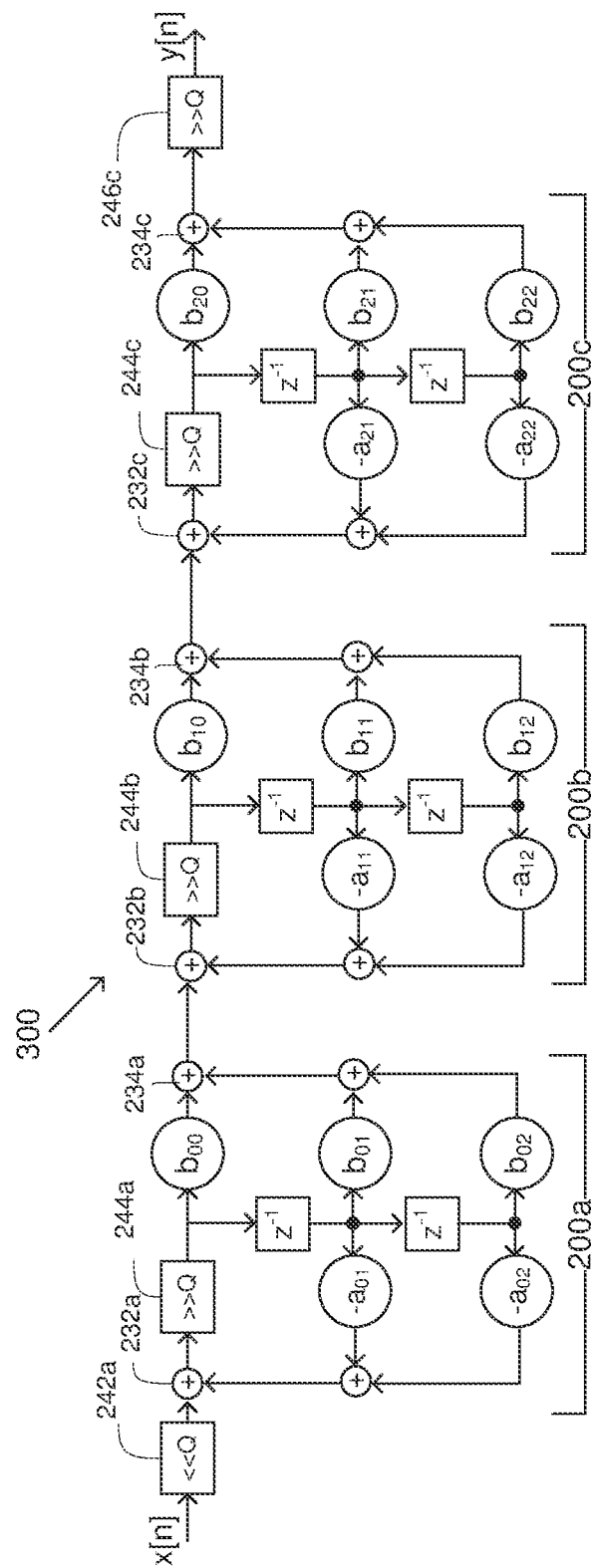
FIGS. 3A-3C are functional block diagrams of example filter chains including multiple IIR filters, in accordance with various aspects described.

Turning now to FIG. 3A, an example filter chain 300 is illustrated in which three DF2 biquads 200a, 200b, 200c are cascaded. In the filter chain 300, the output gain element and adjacent input gain element between stages have been eliminated and no gain related operations are performed between stages. The adjacent gain elements, if left in the chain, would effectuate equal and opposite gains that cancel each other completely (since the magnitude of the shift is equal in both gain elements), reducing precision without any beneficial effect otherwise. In other words, the output of the first level feedforward summing element in each stage (e.g., 234a, 234b) is provided to an input of a first level feedback summing element in a subsequent stage (e.g., 232b, 232c), without the intermediate opposite (e.g., canceling) gain operations being performed on the signal sample. In this manner, quantization error is minimized and SNR is increased. Additional advantages to the filter chain 300 of FIG. 3A include the fact that the first level feedback summing element in each subsequent stage is provided with full precision information. Additionally, when the filter is implemented in software, the contents of the first level feedforward summing element need not be read out as part of a shift operation and the first level feedback summing element in the adjacent stage may simply continue to accumulate products. In other examples, as disclosed below, precision may also be increased by using a common gain element when the values of the gains are not equal in magnitude to avoid unnecessary bitshifting.

Figure 3B:
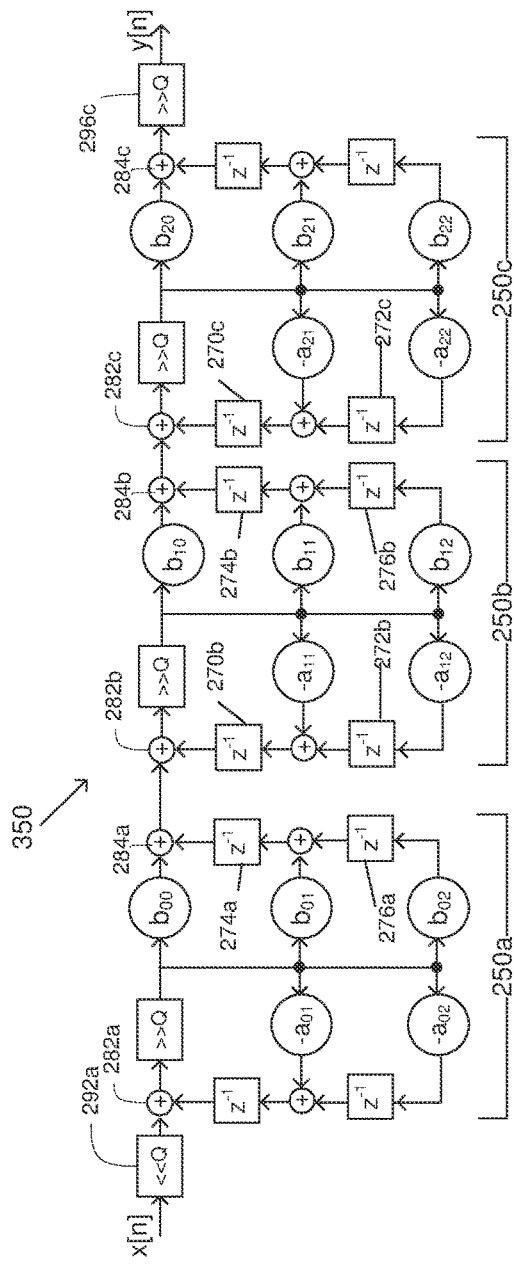

Turning now to FIG. 3B, an example filter chain 350 is illustrated in which three DF1T biquads 250a, 250b, 250c are cascaded. In the filter chain 350, the output gain element and adjacent input gain element between stages have been eliminated. These adjacent gain elements, if left in the chain, would effectuate equal and opposite gains that cancel each other completely (since the magnitude of the shift is equal in both gain elements), reducing precision without any beneficial effect otherwise. In other words, the output of the first level feedforward summing element in each stage (e.g., 284a, 284b) is provided to an input of a first level feedback summing element in a subsequent stage (e.g., 282b, 282c), without the intermediate opposite (e.g., canceling) gain operations being performed on the signal sample. In this manner, quantization error is minimized and SNR is increased. Additional advantages to the filter chain 350 of FIG. 3B include the fact that the first level feedback summing element in each subsequent stage is provided with full precision information. Additionally, when the filter is implemented in software, the contents of the first level feedforward summing element need not be read out as part of a shift operation and the first level feedback summing element in the adjacent stage may simply continue to accumulate products. In other examples, as disclosed below, precision may also be increased by using a common gain element when the values of the gains are not equal in magnitude to avoid unnecessary bitshifting.

Figure 3C:
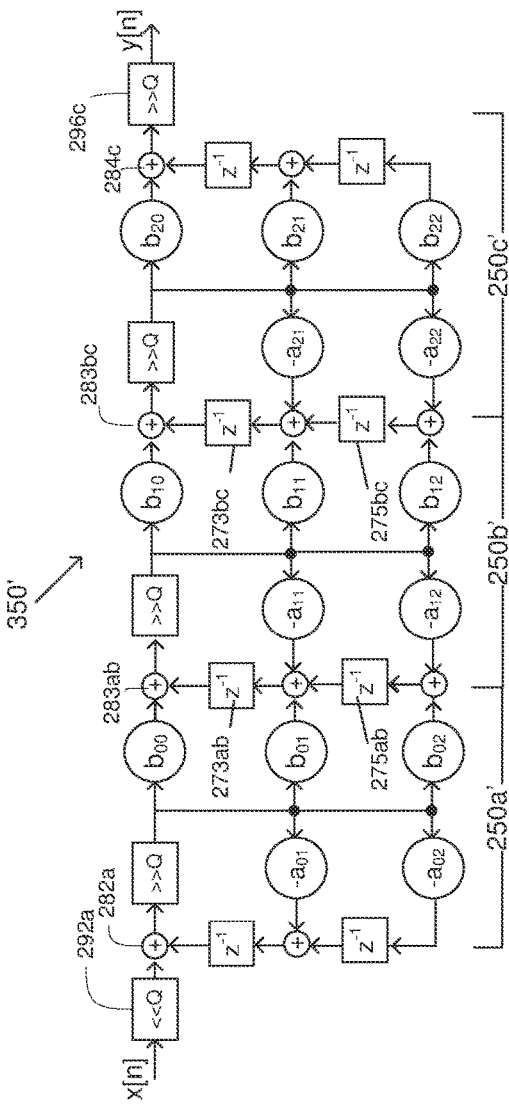

FIG. 3C illustrates an adapted filter chain 350' in which delay elements and summing elements in the filter chain 350 have been combined to reduce the number of storage elements while preserving the filtering behavior including the improved SNR of the filter chain 350. First level delay elements 270b and 274a have been combined as first level delay element 273ab of FIG. 3C. First level delay elements 270c and 274b have been combined as first level delay element 273bc. Second level delay elements 272b and 276a have been combined as second level delay element 275ab. Second level delay elements 272c and 276b have been combined as second level delay element 275bc. Further, first level feedforward summing element 284a and first level feedback summing element 282b have been combined as first level summing element 283ab and first level feedforward summing element 284b and first level feedback summing element 282c have been combined as first level summing element 283bc in FIG. 3C.

Figure 4:
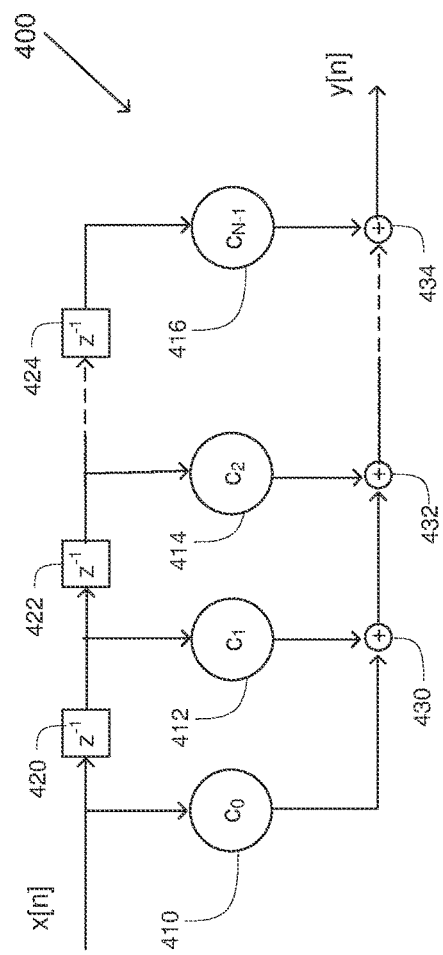
FIG. 4 is a functional block diagram of an example FIR filter.

FIG. 4 illustrates an FIR filter 400 that filters a series of input signal samples x[n] such that each output sample y[n] is a sum of N products, each product corresponding to product of one of N most recent input signal samples and a "c" coefficient ($c_0$-$c_{N-1}$). The filter includes N weighting elements (only 410, 412, 414, 416 are shown), N−1 delay elements (only 420, 422, 424 are shown) and N−1 summing elements (only 430, 432, 434 are shown). The illustrated FIR filter 400 is a textbook implementation in which the coefficients are, in general, floating-point.

Figure 5:
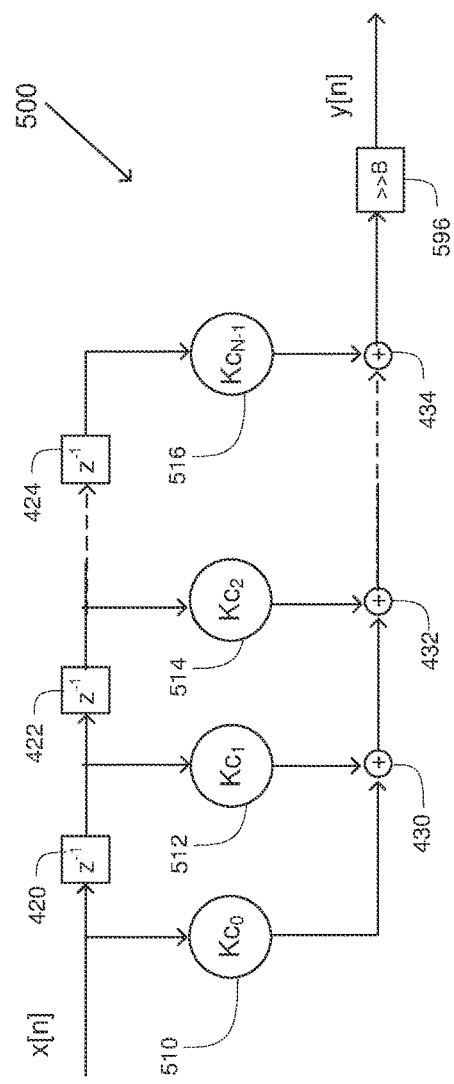
FIG. 5 is a functional block diagram of an example FIR filter adapted for fixed point implementation.

FIG. 5 illustrates an example of a FIR filter 500 that is adapted for fixed-point coefficients making the FIR filter 500 more suitable for use as the FIR filter in a fixed point DSP. The configurable "c" coefficients are scaled by a factor K and a rescaling gain element 596 is added to the design of FIG. 4 to perform a right bitshift of B bits on an output of the final summing element 434 to compensate for the scaling of the coefficients. In one example, the value of B is selected such that $B=\log_2(K)$. In some examples, the value of B and/or K is configurable by a user. While one particular structure of an FIR is illustrated in FIG. 5, it is to be understood that FIRs implemented using transposed structure or polyphase structures may also be used in some examples.

Figure 6:
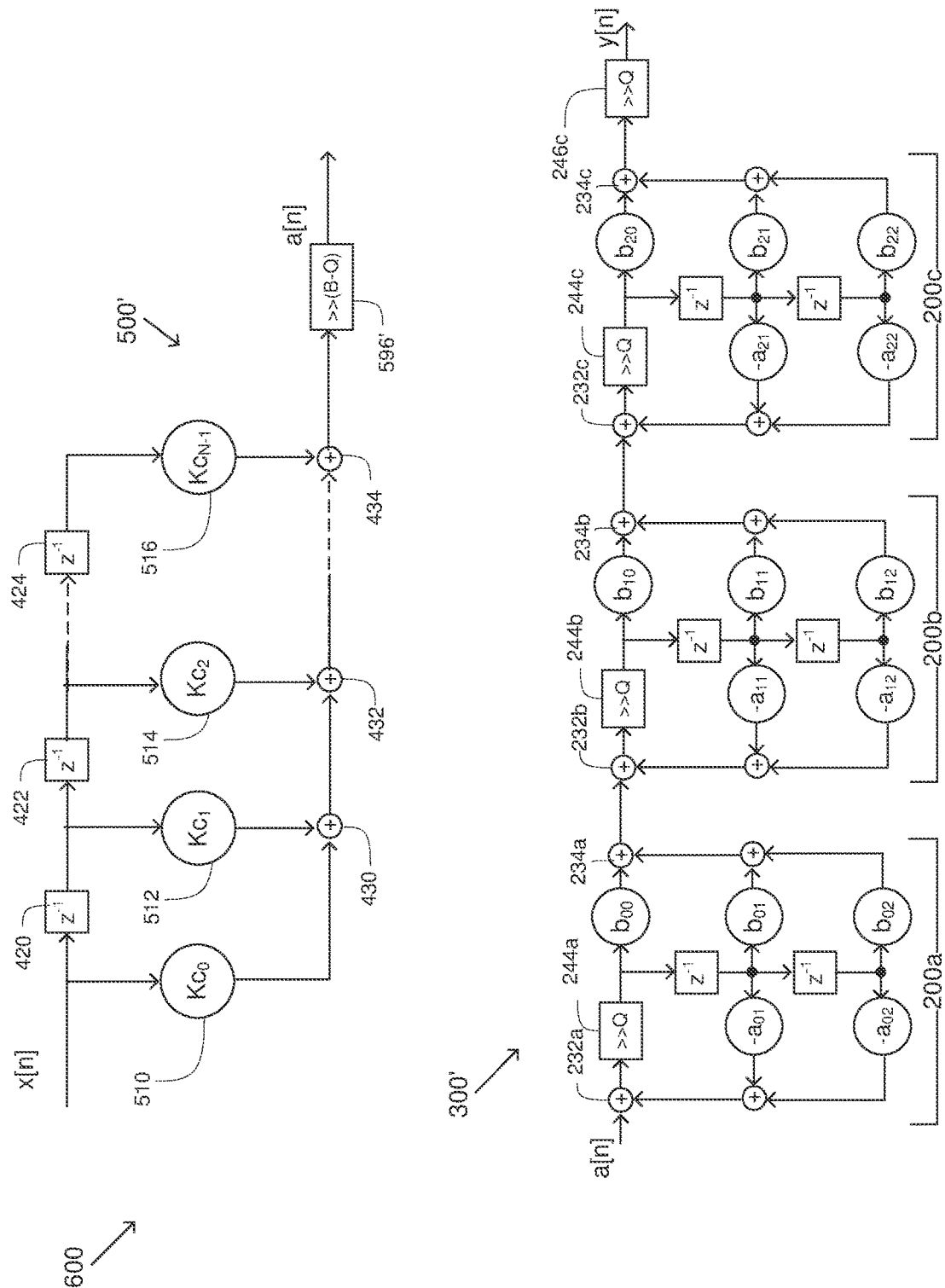
FIG. 6 is a functional block diagram of an example filter chain including an FIR filter and multiple IIR filters, in accordance with various aspects described.

FIG. 6 illustrates a hybrid filter arrangement 600 that includes an FIR filter 500' (adapted from FIR filter 500 of FIG. 5) coupled to an adapted biquad chain 300' (adapted from IIR filter chain 300 of FIG. 3). In the FIR filter 500' a common rescaling gain element 596' performs a "common" bitshift of B-Q bits. As will be described in more detail below, when adjacent gain elements in a filter chain are combined into a common gain element, the gain values of the adjacent gain elements are multiplied to determine the "common" gain value that is applied by the common gain element. In the illustrated examples, the multiplication of the signal samples by the common gain is achieved by a bitshifting operation in which a bitshift associated with the first gain is combined with a bitshift associated with the second gain value to determine the common bitshift. In other words, the common bitshift is equal to a resultant bitshift of the two adjacent bitshifts that would occur when the FIR filter 500 is coupled to the biquad chain 300. The common bitshift may be called a resultant difference that corresponds to a difference of the two adjacent bitshifts having a direction determined by the sign of the difference. The two adjacent bitshifts are right bitshift B (by rescaling gain element 596 of FIR filter 500) and left bitshift Q (by input gain element 242a of biquad chain 300).

Using the common bitshift reduces the loss of precision as compared to separately performing the B bitshift and the Q bitshift. Due to the change in the bitshift performed by the common rescaling gain element 596', the input gain element 242a of biquad chain 300 has been eliminated in the biquad chain 300'. The common rescaling gain element 596' may also be used when the FIR filter 500 is to be coupled to a biquad chain 350 or 350' in which the common rescaling gain element 596' combines the B bitshift of FIR filter 500 with the Q bitshift of the input gain element 292a of the biquad chain 350 or 350' and the input gain element 292a is eliminated from the biquad chain 350 or 350'.

While multiple examples of filter chains including three biquads and an optional FIR filter with combined adjacent gains have been disclosed in FIGS. 3A-3C and 6, it is to be understood that the disclosed techniques related to combining adjacent opposite bitshifts to reduce the number of bitshifts that are performed in a filter chain may be utilized to preserve precision in any filter chain including any number of FIR and IIR filters of any type, configuration, or order.

FIGS. 7A and 7B illustrates generally the concept of common gain and how a common gain can be applied between filters that have input and/or output gain adjustments that are adjacent to one another in a filter chain, cascade, or combination. FIG. 7A illustrates two digital filters 710, 730 coupled together to form a filter chain 700. The first digital filter 710 includes a filter core that includes a plurality of adjustable coefficients (see, e.g., weighting elements in FIGS. 2-6). In addition to the filter core 720, the digital filter 710 may include an optional pre filter gain element 722 that applies an input gain to an input signal by performing a left bitshift of M bits to add LSBs to the input signal. For example, when the digital filter 710 is an IIR filter (see FIGS. 2A, 2B), the pre filter gain element may be included (see, e.g., 242 of FIG. 2A or 292 of FIG. 2B) and when the digital filter 710 is an FIR filter (see FIG. 5), the pre filter gain may be omitted.

The digital filter 710 includes post filter gain element 727 that applies an output gain to an output signal by performing a right bitshift of X bits. For example, when the digital filter 710 is an IIR filter, M=X and the post filter gain element 727 performs a right bitshift of X bits to discard LSBs from the output signal to compensate for the left bitshift of M bits of the pre filter gain element 722 (see, e.g., 246 of FIG. 2A or 296 of FIG. 2B). In another example, when the digital filter 710 is an FIR filter, the post filter gain element 727 performs a right bitshift of X bits to discard LSBs from the output signal to compensate for a scaling that is performed on the adjustable coefficients as discussed with respect to FIG. 5 (see, e.g., 596). Digital filter 730 includes pre filter gain element 742, filter core 740, and post filter gain element 747, which function analogously to their counterparts in digital filter 710. While FIR filters and IIR filters are provided as examples, the digital filters 710, 730 may have other configurations of the filter cores 720, 740 so long as the digital filter 710 includes a post filter gain element 727 and the digital filter 730 includes pre filter gain element 742.

As noted above, the adjacent opposite-direction gain operations performed by the post filter gain element 727 and the pre filter gain element 742 have the effect of reducing precision and decreasing SNR. FIG. 7B illustrates an example filter chain 700' in which a common gain is applied to the intermediate signal samples between the digital filter 710' and the digital filter 730'. The common gain is a resultant gain corresponding to a the difference of the gain X of the post filter gain element 727 and the gain Y of the pre filter gain element 742. In other words the common gain has a magnitude equal to |X−Y| and a direction equal to the direction of the post filter gain X when X>Y or a direction equal to the direction of the pre filter gain Y when X<Y.

When both digital filters 710', 730' are IIR filters, X may be equal to Y as discussed above with respect to FIGS. 3A-3B (bitshifts of Q bits are applied in both pre filter gain elements and post filter gain elements). Thus, the common gain is one and the filter core 720 may be coupled "directly" to the filter core 740 without any intermediate gain operations being performed. Post filter gain element 727 and pre filter gain element 742 are omitted from the filter chain 700' and a common gain element 735 may not be disposed between the digital filter 710' and the digital filter 730' in this example.

When digital filter 710' is an FIR filter and the digital filter 730' is an IIR filter, X may not equal Y as discussed with respect to FIGS. 2A, 2B, and 5 (a bitshift of Q bits is applied by IIR filter input gain element 242, 292 and a bitshift of B bits is applied by FIR rescaling gain element 596). In this example post filter gain element 727 and pre filter gain element 742 are omitted from the filter chain 700' and a common gain element 735 may be disposed between filter core 720 and filter core 740. The common gain element 735 applies a gain corresponding to the resultant of the difference of X and Y. By way of example, if the post filter gain X is effectuated by a right shift of 16 bits and the pre filter gain Y is effectuated by a left shift of 14 bits, then the common gain element will perform a right shift of 2 bits to the intermediate signal samples. The common gain element 735 may be an adapted pre filter gain element or post filter gain element associated with either digital filter that applies the common gain rather than a pre filter gain or post filter gain that was configured for the digital filter. In this example, the other of the pre filter gain element or post filter gain element may be adapted to apply a gain of one rather than a pre filter gain or post filter gain that was configured for the digital filter.

Figure 8:
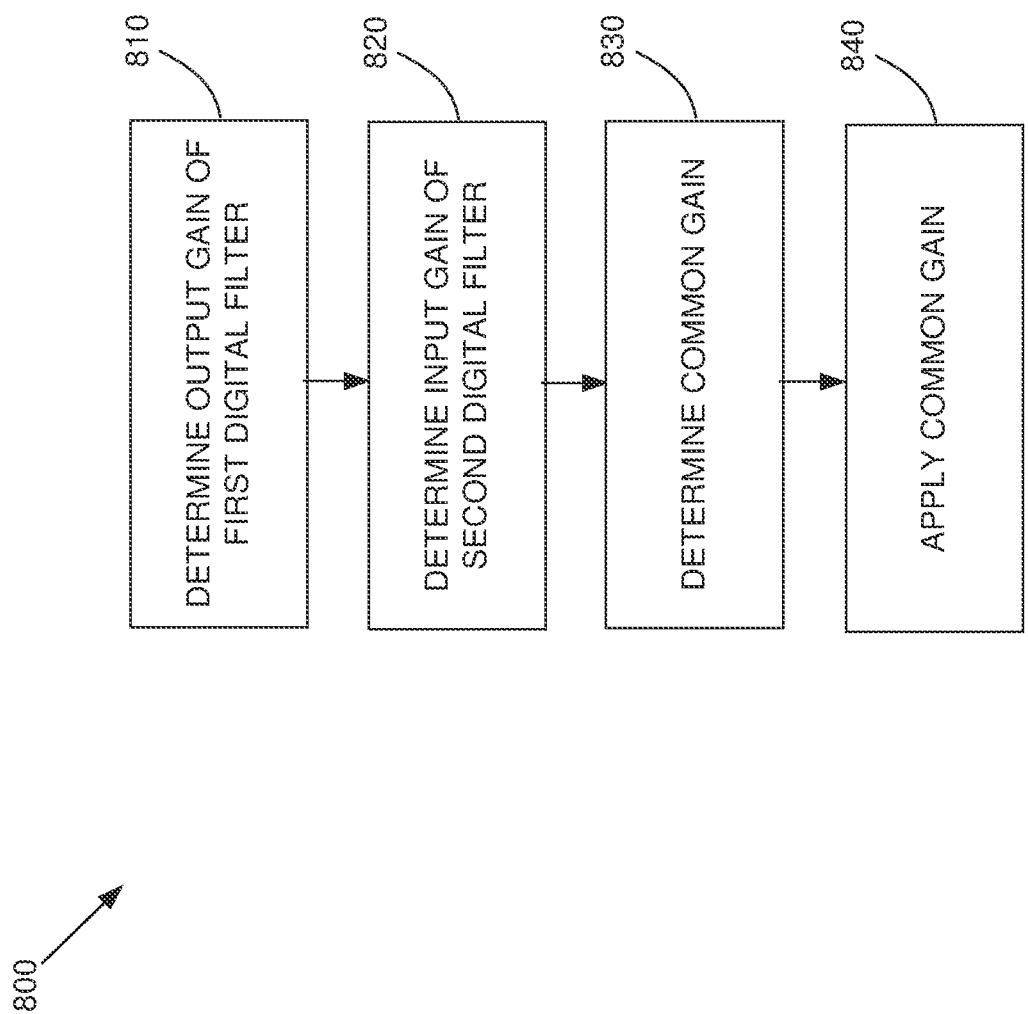
FIG. 8 is a flow diagram outlining an example method for applying a common gain in a filter chain, in accordance with various aspects described.

FIG. 8 is a flow diagram outlining an example method 800 for applying a common gain between adjacent digital filter stages. The method may be performed, for example, by a processor associated with a DSP executing instructions stored in memory associated with the DSP. The method includes, at 810, determining an output gain configured for a first digital filter. For example, the output gain may be a gain configured for gain elements 246 of FIG. 2A, 296 of FIG. 2B, 596 of FIG. 5, or 727 of FIG. 7A. The output gain may be configured by way of a programming interface to instantiate the first digital filter. The method includes, at 820, determining an input gain configured for a second digital filter having an input coupled to an output of the first digital filter. For example, the input gain may be a gain configured for gain elements 242 of FIG. 2A, 292 of FIG. 2B, or 742 of FIG. 7A. The input gain may be configured by way of a programming interface to instantiate the second digital filter.

The method includes, at 830, determining a common gain based on a product of the output gain and the input gain. For example, a DSP, a processor of the DSP, or a combination of hardware and software associated with the DSP may determine the common gain. The method includes, at 840, applying the common gain to signal samples passing between the first digital filter and the second digital filter. In some examples, when the common gain is determined to be 1, a pre filter gain element of the second digital filter and a post filter gain element of the first digital filter are omitted from a filter chain.

In one example, when the output gain comprises a first bitshift of X bits in a first direction and the input gain comprises a second bitshift of Y bits in a second, opposite, direction, the method includes the common gain as a bitshift of |X−Y| bits in a direction corresponding to the direction of the first bitshift when X>Y and corresponding to the direction of the second bitshift when X<Y.

In one example, the method further includes receiving a bitwidth extension value D and determining the common gain based on D. The value bitwidth extension value D may be received, for example, through a programming interface. In one instance of this example, when the output gain comprises a first bitshift of X bits in a first direction and the input gain comprises a second bitshift of Y bits in a second, opposite, direction, the method includes determining the common gain as a bitshift of |X−Y−D| bits in a direction corresponding to the direction of the first bitshift when X>Y+D and corresponding to the direction of the second bitshift when X<Y+D.

Configurable Bit Extension Value for Optimized Bitwidth Utilization

When an IIR filter is implemented in software the products may need to be truncated in order to be stored in the delay elements. Many software implemented filters are designed based on a 32-bit word and the delay elements may store 32 bits. While an increased number of bits would increase precision, a significant increase in cost and arithmetic complexity would be incurred. The pre and post filter gain elements disclosed above for IIR filters perform opposite Q bitshifts related to quantization and coefficient scaling to efficiently use the 32 bits for most filter configurations. Generally speaking the pre filter gain operation on the input sample to add LSBs is performed so that the filtering calculations are performed on LSBs to increase precision. The pre-configured pre filter gain value (e.g., effectuated by the bitshift of Q bits) may be selected as a conservatively low value to prevent bitwidth overflow in most applications. Depending the number of IIR filters that are chained together and the relative values of the coefficients, an additional bitshift of D bits may make better use of the 32 bit width. However, as the value of D increases at some point the additional bitshift will cause the 32 bit width to be exceeded.

Figure 9A:
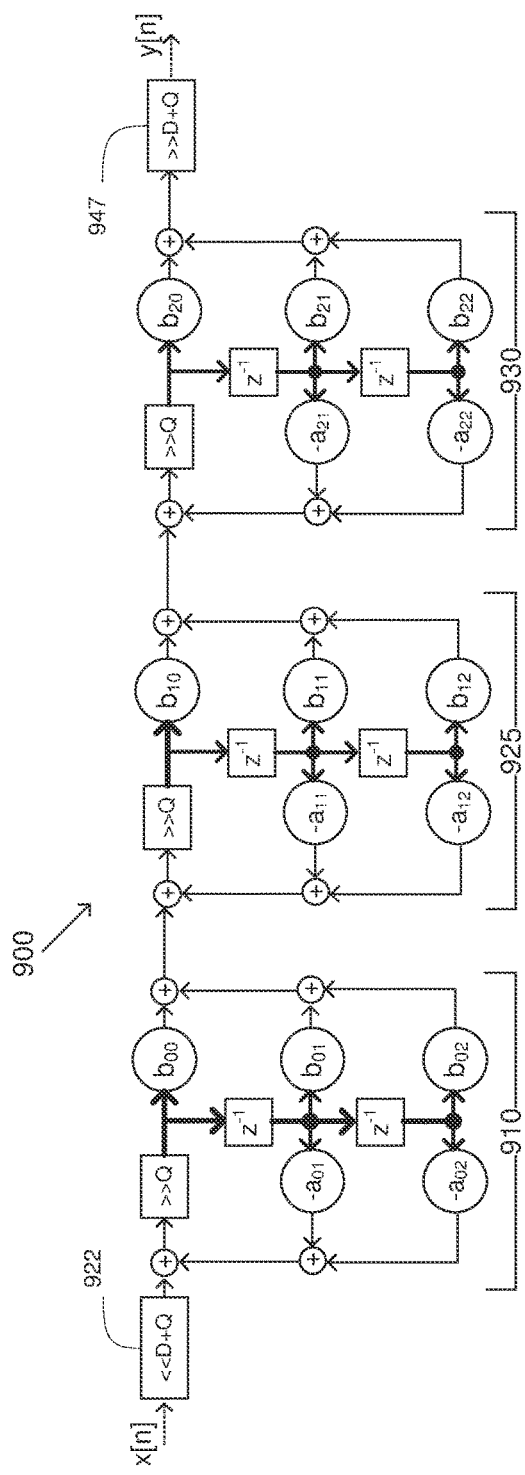
FIGS. 9A and 9B are functional block diagrams of example filter chains that utilize a programmable bitwidth extension value, in accordance with various aspects described.

FIG. 9A illustrates a filter chain 900 of DF2 biquads as described in connection with FIG. 3A. A first biquad 910 includes an adjustable input gain element 922, a second biquad 925 includes a filter core without a pre filter gain element or a post filter gain element, and a third biquad includes adjustable output filter gain element. In the figure, 16 bit signal samples are illustrated in dotted line, 32 bit signal samples are illustrated in heavy line, and 72 bit signal samples are illustrated in standard line weight. It can be seen that 72 bit samples are truncated to 32 bits before and after delay elements due to the word length limit imposed by the related storage elements. A programmable bitwidth extension value D is provided that causes performance of additional pre and post filter gain shifts (e.g., in addition to a "pre-configured" quantization bitshift Q). The bitwidth extension value is applied by an adjustable input gain element 922 and an adjustable output gain element 947. The programmable bitwidth extension feature allows a designer to make a more efficient use of the 32 bit word length depending on a particular filter configuration. In one example for a chain of 3 DF2 biquads implementing a band-pass filter, the bitwidth shift extension value D may be set to 7. In other examples, depending on filter configuration, the bitwidth extension value may be negative to avoid overflow of delay elements by reducing the number of bits shifted by the pre and post filter gain elements. Other types and orders of biquads, e.g., DF1, DF1T, DF2T, and so on may also benefit from the additional pre and post filter gain shift configured via the bitwidth extension value D.

Figure 9B:
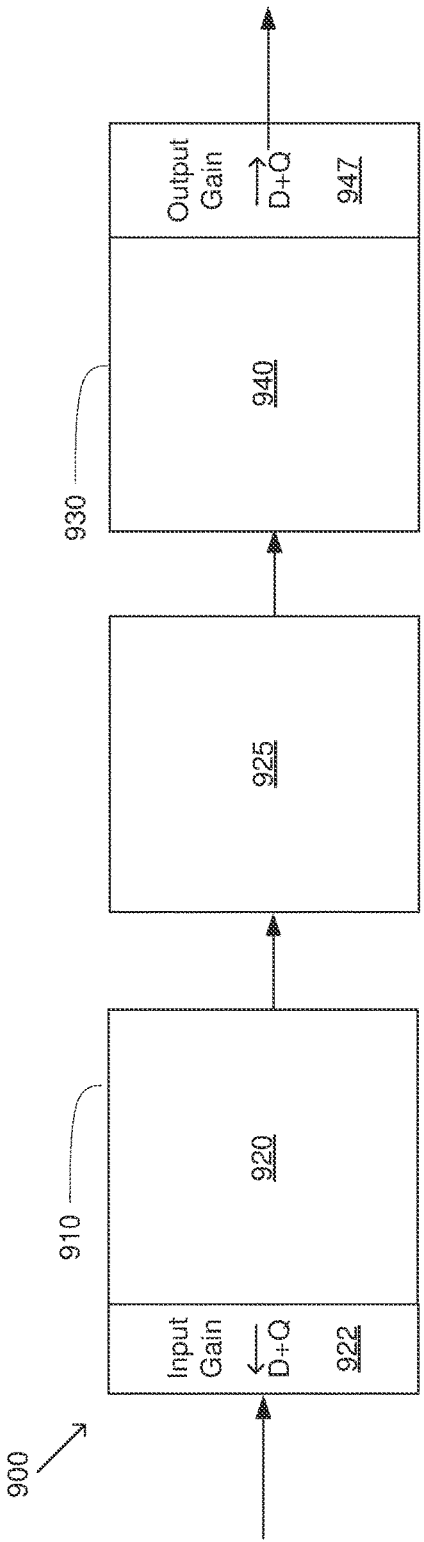

FIG. 9B illustrates a generalized version of the filter chain 900 in which the adjustable input gain element 922 performs a gain adjustment that is a sum of a bitwidth extension value D and a quantization related bitshift configured for a first biquad 910 (e.g., "Q") in the filter chain. Likewise, the adjustable output gain element 947 performs a gain adjustment that is an opposite of the sum of a bitwidth extension value D and the quantization related bitshift Q. The bitshift Q may be configured through a programming interface (e.g., 180 of FIG. 1) as part of instantiation of the digital filters or may be pre-configured. The bitwidth extension value D may be separately programmed by way of the programming interface.

Figure 10:
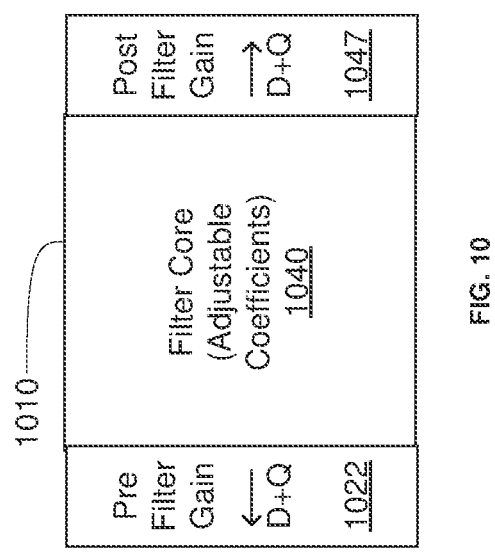
FIG. 10 is a functional block diagram of example filter that utilizes a programmable bitwidth extension value, in accordance with various aspects described.

FIG. 10 illustrates a generalized IIR filter 1010 (e.g., DF1T biquad or DF2 biquad) in which a bitwidth extension value D is combined with a quantization related bitshift (e.g., Q) configured for the IIR filter 1010 in an adjustable pre filter gain element 1022 and an adjustable post filter gain element 1047. As described with reference to FIG. 9B, the bitshifts Q and D may be separately configured for the filter, possibly by way of a programming interface (e.g., 180 of FIG. 1). In IIR filter topologies without pre and post filter gain elements (e.g., DF1 biquad or DF2T biquad) D may be used to prescribe a pre and post filter bitshift.

In one example, a cascaded filter structure (e.g., as shown in FIG. 3A) suitable for implementing a band-pass filter (e.g., with D set to 7) may be converted to a high-pass filter in which a single biquad performs the filtering by decreasing D (e.g. from 7 to 3) and adapting the coefficients of the subsequent biquads such that the output of the first biquad is not modified by the subsequent biquads. This approach optimizes the usage of filter states, avoids overflows, and allows for reuse of the same software or hardware for different application cases.

In one example, a value for D may be selected from amongst a number of pre-configured values, where each pre-configured value is mapped to one or more filter characteristics (e.g., a type of filter being instantiated).

Figure 11:
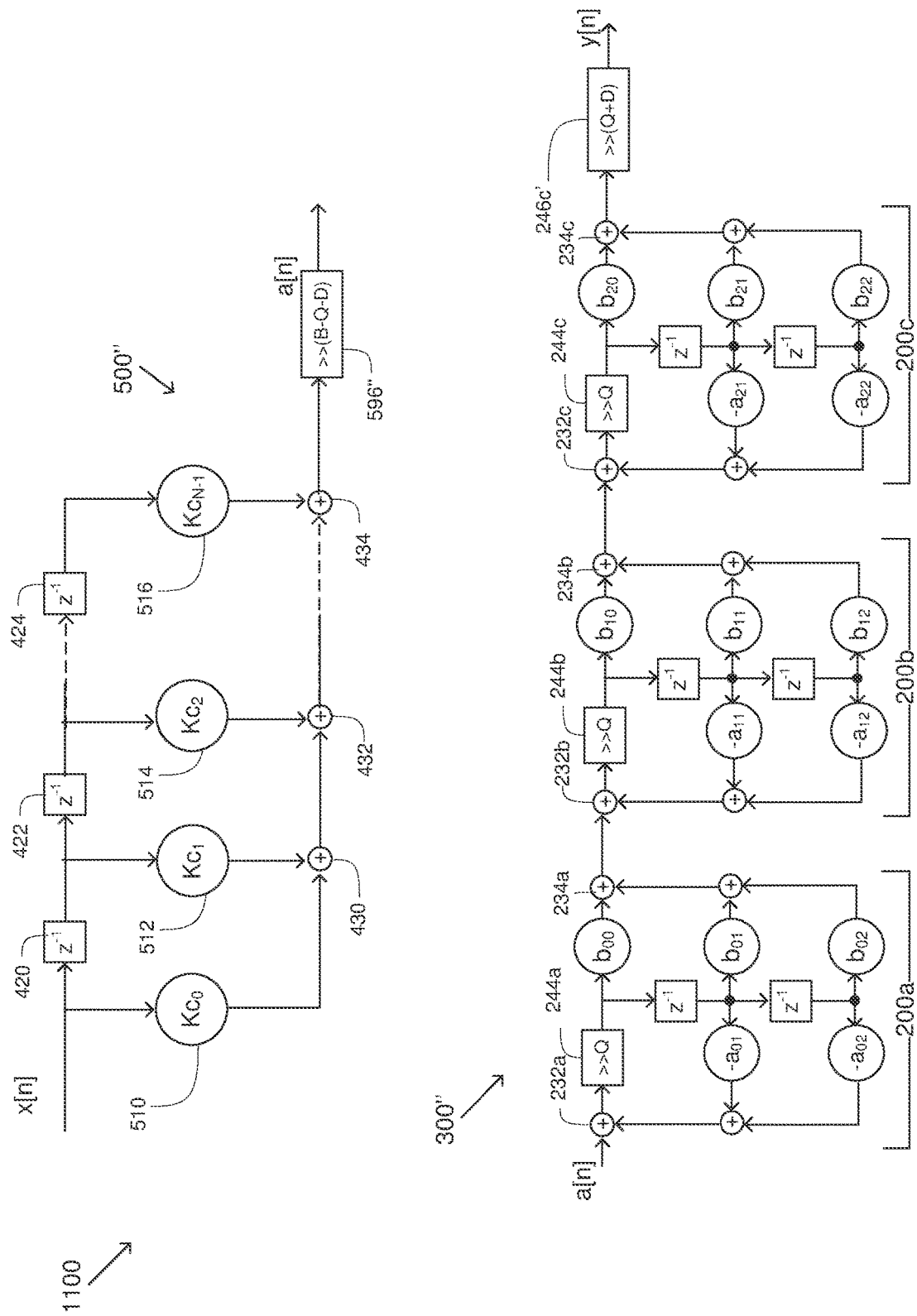
FIG. 11 is a functional block diagram of an example filter chain including an FIR filter and multiple IIR filters that utilizes a programmable bitwidth extension value, in accordance with various aspects described.

FIG. 11 illustrates a hybrid filter arrangement 1100 that utilizes the common gain techniques described above in addition to a programmable bitwidth extension value D. The hybrid filter arrangement 1100 includes an FIR filter 500" (adapted from FIR filter 500 of FIG. 5) coupled to an adapted biquad chain 300" (adapted from IIR filter chain 300 of FIG. 3A). In the FIR filter 500" an adjustable common rescaling gain element 596" performs a common bitshift of B-Q-D bits. The adjacent bitshifts that result in the common gain applied by the adjustable common rescaling gain element 596" are right bitshift B (by rescaling gain element 596 of FIR filter 500) and left bitshift Q (by input gain element 242a of biquad chain 300) and left bitshift D. Using the common bitshift reduces the loss of precision as compared to separately performing the right bitshift of B bits, the left bitshift of Q bits, and the left bitshift of D bits. Due to the common gain related bitshift performed by the adjustable common rescaling gain element 596", the input gain element 242a of biquad chain 300 has been eliminated in the biquad chain 300".

The adjustable common rescaling gain element 596" may also be used when the FIR filter 500 is to be coupled to a biquad chain 350 or 350'. In this example, the adjustable common rescaling gain element 596" combines the rescaling gain related bitshift of B bits associated with the FIR filter 500 with the bitshift of Q bits associated with the input gain element 292a of the biquad chain 350 or 350' and the bitshift of D bits prescribed by the programmable bitwidth extension value. The input gain element 292a is eliminated from the biquad chain 350 or 350'.

To compensate for the left bitshift of D bits performed by the adjustable common rescaling gain element 596", an adjustable output gain element 246c' applies a right bitshift of D bits in addition to the right bitshift of Q bits. The hybrid filter arrangement 1100 supports use of a programmable bitwidth extension value D and also benefits from SNR improvements due to the use of the common gain techniques by providing adjustable common rescaling gain element 596" and adjustable output gain element 246c'.

It can be seen from the foregoing description that the described systems, circuitries, and methods improve SNR, bitwidth utilization, and reuse of components for different applications in digital or software implemented filters.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform margin testing according to embodiments and examples described herein.

Example 1 is a digital filter chain including a first digital filter; and a second digital filter having an input coupled to an output of the first digital filter. A common gain is applied to signal samples passing between the first digital filter and the second digital filter, the common gain corresponding to a product of an output gain associated with the first digital filter and an input gain associated with the second digital filter.

Example 2 includes the subject matter of example 1, including or omitting optional elements, wherein the output gain includes a first bitshift of X bits in a first direction and the input gain includes a second bitshift of Y bits in a second, opposite, direction and the common gain is a bitshift of |X−Y| bits in a direction corresponding to the direction of the first bitshift when X>Y and corresponding to the direction of the second bitshift when X<Y.

Example 3 includes the subject matter of example 1, including or omitting optional elements, wherein the output gain includes a first bitshift of X bits in a first direction and the input gain includes a second bitshift of Y bits in a second, opposite, direction and the common gain is a bitshift of |X−Y−D| bits in a direction corresponding to the direction of the first bitshift when X>Y+D and corresponding to the direction of the second bitshift when X<Y+D, wherein D is a programmable bitwidth extension value.

Example 4 includes the subject matter of example 1, including or omitting optional elements, wherein the first digital filter includes a first infinite impulse response (IIR) filter and the second digital filter includes a second IIR filter; and the output gain of the first IIR filter and the input gain of the second IIR filter are selected such that a resulting gain is one.

Example 5 includes the subject matter of example 4, including or omitting optional elements, wherein no gain elements are disposed between the output of the first IIR filter and the input of the second IIR filter.

Example 6 includes the subject matter of example 4, including or omitting optional elements, the first IIR filter includes an input gain element configured to apply a first gain to an input signal sample; a first set of delay elements and weighting elements configured to generate a first set of products that are in a feedback path of the IIR filter; a first feedback summing element configured to add the first set of products to an output of the input gain element; a first intermediate gain element configured to apply a second gain that is inversely proportional to the first gain to the output of the first feedback summing element; a second set of delay elements and weighting elements configured to generate a second set of products that are in a feedforward path of the IIR filter; a first feedforward summing element configured to add the second set of products to a weighted output of the first intermediate gain element. The second IIR includes a third set of delay elements and weighting elements configured to generate a third set of products that are in a feedback path of the IIR filter; a second feedback summing element configured to add the third set of products to an output of the first feedforward summing element; a second intermediate gain element configured to apply the second gain to the output of the second feedback summing element; a fourth set of delay elements and weighting elements configured to generate a fourth set of products that are in a feedforward path of the IIR filter; a second feedforward summing element configured to add the fourth set of products to a weighted output of the second intermediate gain element; and an output gain element configured to apply the second gain to an output of the second feedforward summing element, such that no gain related operations are performed on signal samples between the output of the first feedforward summing element and the input of the second feedback summing element.

Example 7 includes the subject matter of example 1, including or omitting optional elements, wherein the first digital filter is an IIR filter including an adjustable output gain element, the adjustable output gain element configured to apply a first gain value to an output signal sample, the first gain value including a resultant difference of a bitshift configured for the first digital filter and a bitwidth extension value; and the second digital filter is an IIR filter including an adjustable input gain element, the adjustable input gain element configured to apply a second gain value that is inversely proportional to the first gain value to an input signal sample, the second gain value including an opposite of the resultant difference of a bitshift configured for the second digital filter and the bitwidth extension value.

Example 8 includes the subject matter of example 7, including or omitting optional elements, wherein the bitwidth extension value is received by way of a programming interface.

Example 9 includes the subject matter of example 7, including or omitting optional elements, wherein the bitwidth extension value is determined based on a mapping of bitwidth extension values to one or more filter characteristics.

Example 10 includes the subject matter of example 1, including or omitting optional elements, including a common gain element disposed between the first digital filter and the second digital filter configured to apply the common gain to signal samples passing between the first digital filter and second digital filter.

Example 11 is a digital filter chain, including a first digital filter comprising a fixed point finite impulse response (FIR) filter, wherein the first digital filter comprises an output gain element; and a second digital filter having an input coupled to an output of the first digital filter, the second digital filter comprising an IIR filter. The output gain element applies a common output gain value comprising a product of an input gain configured in association with the second digital filter and an FIR output gain that is based on a scaling factor K associated with the first digital filter.

Example 12 includes the subject matter of example 11, including or omitting optional elements, wherein the FIR filter is comprised of a polyphase or transposed structure.

Example 13 includes the subject matter of example 11, including or omitting optional elements, wherein the common gain value comprises a resultant difference of a first bitshift corresponding to the input gain, a second bitshift corresponding to the FIR output gain, and a third bitshift corresponding to a bitwidth extension value.

Example 14 includes the subject matter of example 13, including or omitting optional elements, wherein the bitwidth extension value is programmed by way of a programming interface.

Example 15 is a digital filter including an adjustable input gain element, the adjustable input gain element configured to apply a gain value to an input signal sample, the gain value including a resultant difference of a bitshift configured for the digital filter and a bitwidth extension value; and an adjustable output gain element, the adjustable output gain element configured to apply an opposite of the gain value to an output signal sample.

Example 16 includes the subject matter of example 15, including or omitting optional elements, wherein the bitwidth extension value is received by way of a programming interface.

Example 17 includes the subject matter of example 15, including or omitting optional elements, wherein the bitwidth extension value is determined based on a mapping of bitwidth extension values to one or more filter characteristics.

Example 18 is a method, including determining an output gain configured for a first digital filter; and determining an input gain configured for a second digital filter having an input coupled to an output of the first digital filter; and determining a common gain based on a product of the output gain and the input gain; and applying the common gain to signal samples passing between the first digital filter and the second digital filter.

Example 19 includes the subject matter of example 18, including or omitting optional elements, wherein the output gain includes a first bitshift of X bits in a first direction and the input gain includes a second bitshift of Y bits in a second, opposite, direction and the common gain is a bitshift of |X−Y| bits in a direction corresponding to the direction of the first bitshift when X>Y and corresponding to the direction of the second bitshift when X<Y.

Example 20 includes the subject matter of example 18, including or omitting optional elements, further including receiving a bitwidth extension value D; and determining the common gain based on D.

Example 21 includes the subject matter of example 20, including or omitting optional elements, wherein the output gain includes a first bitshift of X bits in a first direction and the input gain includes a second bitshift of Y bits in a second, opposite, direction and the common gain is a bitshift of |X−Y−D| bits in a direction corresponding to the direction of the first bitshift when X>Y+D and corresponding to the direction of the second bitshift when X<Y+D.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

In this description and the appended claims, use of the term "determine" with reference to some entity (e.g., parameter, variable, and so on) in describing a method step or function is to be construed broadly. For example, "determine" is to be construed to encompass, for example, receiving and parsing a communication that encodes the entity or a value of an entity. "Determine" should be construed to encompass accessing and reading memory (e.g., lookup table, register, device memory, remote memory, and so on) that stores the entity or value for the entity. "Determine" should be construed to encompass computing or deriving the entity or value of the entity based on other quantities or entities. "Determine" should be construed to encompass any manner of deducing or identifying an entity or value of the entity.

As used herein, the term identify when used with reference to some entity or value of an entity is to be construed broadly as encompassing any manner of determining the entity or value of the entity. For example, the term identify is to be construed to encompass, for example, receiving and parsing a communication that encodes the entity or a value of the entity. The term identify should be construed to encompass accessing and reading memory (e.g., device queue, lookup table, register, device memory, remote memory, and so on) that stores the entity or value for the entity.

As used herein, the term select when used with reference to some entity or value of an entity is to be construed broadly as encompassing any manner of determining the entity or value of the entity from amongst a plurality or range of possible choices. For example, the term select is to be construed to encompass accessing and reading memory (e.g., lookup table, register, device memory, remote memory, and so on) that stores the entities or values for the entity and returning one entity or entity value from amongst those stored. The term select is to be construed as applying one or more constraints or rules to an input set of parameters to determine an appropriate entity or entity value. The term select is to be construed as broadly encompassing any manner of choosing an entity based on one or more parameters or conditions.

As used herein, the term derive when used with reference to some entity or value of an entity is to be construed broadly. "Derive" should be construed to encompass accessing and reading memory (e.g., lookup table, register, device memory, remote memory, and so on) that stores some initial value or foundational values and performing processing and/or logical/mathematical operations on the value or values to generate the derived entity or value for the entity. "Derive" should be construed to encompass computing or calculating the entity or value of the entity based on other quantities or entities. "Derive" should be construed to encompass any manner of deducing or identifying an entity or value of the entity.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuit, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein the term "or" includes the option of all elements related by the word or. For example A or B is to be construed as include only A, only B, and both A and B. Further the phrase "one or more of" followed by A, B, or C is to be construed as including A, B, C, AB, AC, BC, and ABC

What is claimed is:

1. A digital filter chain comprising:
   a first digital filter; and
   a second digital filter having an input coupled to an output of the first digital filter; and
   a common gain element disposed between the first digital filter and the second digital filter configured to apply a common gain to signal samples passing between the first digital filter and second digital filter, wherein the common gain corresponds to a product of an output gain associated with the first digital filter and an input gain associated with the second digital filter.

2. The digital filter chain of claim 1, wherein the output gain comprises a first bitshift of X bits in a first direction and the input gain comprises a second bitshift of Y bits in a second, opposite, direction and the common gain is a bitshift of |X−Y| bits in a direction corresponding to the direction of the first bitshift when X>Y and corresponding to the direction of the second bitshift when X<Y.

3. The digital filter chain of claim 1, wherein the output gain comprises a first bitshift of X bits in a first direction and the input gain comprises a second bitshift of Y bits in a second, opposite, direction and the common gain is a bitshift of |X−Y−D| bits in a direction corresponding to the direction of the first bitshift when X>Y+D and corresponding to the direction of the second bitshift when X<Y+D, wherein D is a programmable bitwidth extension value.

4. A digital filter chain comprising:
   a first infinite impulse response (IIR) filter; and
   a second infinite impulse response (IIR) filter having an input coupled to an output of the first infinite impulse response (IIR) filter; and
   wherein a common gain is applied to signal samples passing between the first IIR filter and the second IIR filter, the common gain corresponding to a product of an output gain associated with the first IIR filter and an input gain associated with the second IIR filter, wherein the output gain of the first IIR filter and the input gain of the second IIR filter are selected such that a resulting common gain is one.

5. The digital filter chain of claim 4, wherein no gain elements are disposed between the output of the first IIR filter and the input of the second IIR filter.

6. The digital filter chain of claim 4, wherein
   the first IIR filter comprises
      an input gain element configured to apply a first gain to an input signal sample;
      a first set of delay elements and weighting elements configured to generate a first set of products that are in a feedback path of the IIR filter;
      a first feedback summing element configured to add the first set of products to an output of the input gain element;
      a first intermediate gain element configured to apply a second gain that is inversely proportional to the first gain to the output of the first feedback summing element;
      a second set of delay elements and weighting elements configured to generate a second set of products that are in a feedforward path of the IIR filter;
      a first feedforward summing element configured to add the second set of products to a weighted output of the first intermediate gain element; and
   the second IIR comprises
      a third set of delay elements and weighting elements configured to generate a third set of products that are in a feedback path of the IIR filter;
      a second feedback summing element configured to add the third set of products to an output of the first feedforward summing element;
      a second intermediate gain element configured to apply the second gain to the output of the second feedback summing element;
      a fourth set of delay elements and weighting elements configured to generate a fourth set of products that are in a feedforward path of the IIR filter;
      a second feedforward summing element configured to add the fourth set of products to a weighted output of the second intermediate gain element; and
      an output gain element configured to apply the second gain to an output of the second feedforward summing element,
   such that no gain related operations are performed on signal samples between the output of the first feedforward summing element and the input of the second feedback summing element.

7. The digital filter chain of claim 4, wherein
   the first IIR filter comprises an adjustable output gain element, the adjustable output gain element configured to apply a first gain value to an output signal sample, the first gain value comprising a resultant difference of a bitshift configured for the first IIR filter and a bitwidth extension value; and
   the second IIR filter comprises an adjustable input gain element, the adjustable input gain element configured to apply a second gain value that is inversely proportional to the first gain value to an input signal sample.

8. The digital filter chain of claim 7, wherein the bitwidth extension value is received by way of a programming interface.

9. The digital filter chain of claim 7, wherein the bitwidth extension value is determined based on a mapping of bitwidth extension values to one or more filter characteristics.

10. A method, comprising:
    determining an output gain configured for a first digital filter;
    determining an input gain configured for a second digital filter having an input coupled to an output of the first digital filter;
    determining a common gain based on a product of the output gain and the input gain; and applying the common gain to signal samples passing between the first digital filter and the second digital filter, without applying the output gain or the input gain to the signal samples.

11. The method of claim 10, wherein the output gain comprises a first bitshift of X bits in a first direction and the input gain comprises a second bitshift of Y bits in a second, opposite, direction and the common gain is a bitshift of |X−Y| bits in a direction corresponding to the direction of the first bitshift when X>Y and corresponding to the direction of the second bitshift when X<Y.

12. The method of claim 10, further comprising
receiving a bitwidth extension value D; and
determining the common gain based on D.

13. The method of claim 12, wherein the output gain comprises a first bitshift of X bits in a first direction and the input gain comprises a second bitshift of Y bits in a second, opposite, direction and the common gain is a bitshift of |X−Y−D| bits in a direction corresponding to the direction of the first bitshift when X>Y+D and corresponding to the direction of the second bitshift when X<Y+D.

\* \* \* \* \*